United States Patent
Moazzami et al.

(10) Patent No.: US 10,693,462 B2
(45) Date of Patent: *Jun. 23, 2020

(54) GROUND INTERMEDIATION FOR INTER-DOMAIN BUFFER STAGES

(71) Applicant: SHENZHEN GOODIX TECHNOLOGY CO., LTD., Shenzhen (CN)

(72) Inventors: Kaveh Moazzami, San Diego, CA (US); Faisal Hussein, San Diego, CA (US); Ahmed Emira, San Diego, CA (US)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/574,178

(22) Filed: Sep. 18, 2019

(65) Prior Publication Data

US 2020/0136620 A1  Apr. 30, 2020

Related U.S. Application Data

(63) Continuation of application No. 16/171,357, filed on Oct. 25, 2018, now Pat. No. 10,461,749.

(51) Int. Cl.
*H03K 19/003* (2006.01)
*H03F 3/195* (2006.01)

(52) U.S. Cl.
CPC ....... *H03K 19/00361* (2013.01); *H03F 3/195* (2013.01); *H03F 2203/45582* (2013.01); *H03F 2203/45592* (2013.01); *H03F 2203/45596* (2013.01); *H03F 2203/45622* (2013.01)

(58) Field of Classification Search
None
See application file for complete search history.

(56) References Cited

U.S. PATENT DOCUMENTS

2013/0099817 A1* 4/2013 Haigh ............... H03K 19/003
326/21
2015/0280714 A1* 10/2015 Kumar ............ H03K 19/0185
327/333

* cited by examiner

*Primary Examiner* — Crystal L Hammond
(74) *Attorney, Agent, or Firm* — Kilpatrick Townsend & Stockton LLP (57) ABSTRACT

Techniques are described for ground-intermediating buffering that can effectively use the reference grounds of the circuit domains on either side of a buffer stage to generate one or more intermediated grounds for one or more signal buffers. For example, one of the reference grounds has a first amount of ground noise, the other of the reference grounds has a second amount of ground noise that is greater than or less than the first amount, and the intermediated grounds are generated to have respective amounts of ground noise that are between the first and second amounts. The ground intermediating buffer can perform signal buffering with respect to the intermediated ground(s), thereby reducing ground noise coupling across the circuit domains through both the signal and ground paths of the buffer stage.

20 Claims, 5 Drawing Sheets

FIG. 1

(PRIOR ART)

GROUND INTERMEDIATION FOR INTER-DOMAIN BUFFER STAGES

REFERENCES TO RELATED APPLICATIONS

This application is a Continuation of U.S. application Ser. No. 16/171,357, for "GROUND INTERMEDIATION FOR INTER-DOMAIN BUFFER STAGES" filed on Oct. 25, 2018, which is hereby incorporated by reference in its entirety for all purposes.

FIELD OF THE INVENTION

The present invention relates generally to electronic circuits. More particularly, embodiments of the present invention relate to ground intermediation for buffer stages between circuit domains, such as between radiofrequency circuits having different reference clocks.

BACKGROUND OF THE INVENTION

Many integrated circuits include multiple functional circuit blocks, or domains. Often, each domain has its own supply voltage and its own reference ground. Some domains can be relatively noisy, which can result in relatively more noise being present on their reference ground signals. In some such integrated circuits, digital signals, such as radiofrequency clock and/or data signals, are communicated between the domains. As those signals are transferred across different domains that have different reference grounds, various amounts of noise present on certain of the reference ground signals with respect to others of the reference ground signals can impact performance of the various circuits. For example, the different amounts of ground noise can impact timing of signal edges, which can manifest as various types of noise, including as spectral phase noise.

BRIEF SUMMARY OF THE INVENTION

Embodiments include circuits, devices, and methods for ground-intermediating buffering that can effectively use the reference grounds of the circuit domains on either side of a buffer stage to generate one or more intermediated grounds for one or more signal buffers. For example, one of the reference grounds has a first amount of ground noise, the other of the reference grounds has a second amount of ground noise that is greater than or less than the first amount, and the intermediated grounds are generated to have respective amounts of ground noise that are between the first and second amounts. The ground intermediating buffer can perform signal buffering with respect to the intermediated ground(s), thereby reducing ground noise coupling across the circuit domains through both the signal and ground paths of the buffer stage.

According to one set of embodiments, integrated circuit system is provided. The system includes a ground intermediating buffer subsystem that has: a ground intermediator circuit coupled between a first circuit ground of a first circuit domain and a second circuit ground of a second circuit domain to generate an intermediated ground, such that operation of the first circuit domain produces a first quantity of ground noise on the first circuit ground, operation of the second circuit domain produces a second quantity of ground noise on the second circuit ground, and the intermediated ground is generated to have a third quantity of ground noise between the first quantity of ground noise and the second quantity of ground noise; and a signal buffer circuit referenced to the intermediated ground and having a buffer output generated responsive to a buffer input, the buffer input coupled with a signal output node of the first circuit domain, and the buffer output coupled with a signal input node of the second circuit domain.

According to another set of embodiments, a ground intermediating buffer is provided. The ground intermediating buffer includes means for generating an intermediated ground responsive to a first circuit ground of a first circuit domain and a second circuit ground of a second circuit domain, wherein operation of the first circuit domain produces a first quantity of ground noise on the first circuit ground and operation of the second circuit domain produces a second quantity of ground noise on the second circuit ground, and the intermediated ground is generated to have a third quantity of ground noise that is between the first quantity of ground noise and the second quantity of ground noise. The ground intermediating buffer also includes means for relaying a radiofrequency signal, having: means for receiving the radiofrequency signal from the first circuit domain; means for buffering the radiofrequency signal referenced to the intermediated ground to output a buffered signal corresponding to the radiofrequency signal; and means for transmitting the buffered signal to the second circuit domain.

According to another set of embodiments, a method for ground intermediating buffering is provided. The method includes: generating an intermediated ground responsive to a first circuit ground of a first circuit domain and a second circuit ground of a second circuit domain, wherein operation of the first circuit domain produces a first quantity of ground noise on the first circuit ground and operation of the second circuit domain produces a second quantity of ground noise on the second circuit ground, and the intermediated ground is generated to have a third quantity of ground noise that is between the first quantity of ground noise and the second quantity of ground noise; receiving a radiofrequency signal from the first circuit domain; buffering the radiofrequency signal in reference to the intermediated ground to output a buffered signal corresponding to the radiofrequency signal; and transmitting the buffered signal to the second circuit domain.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
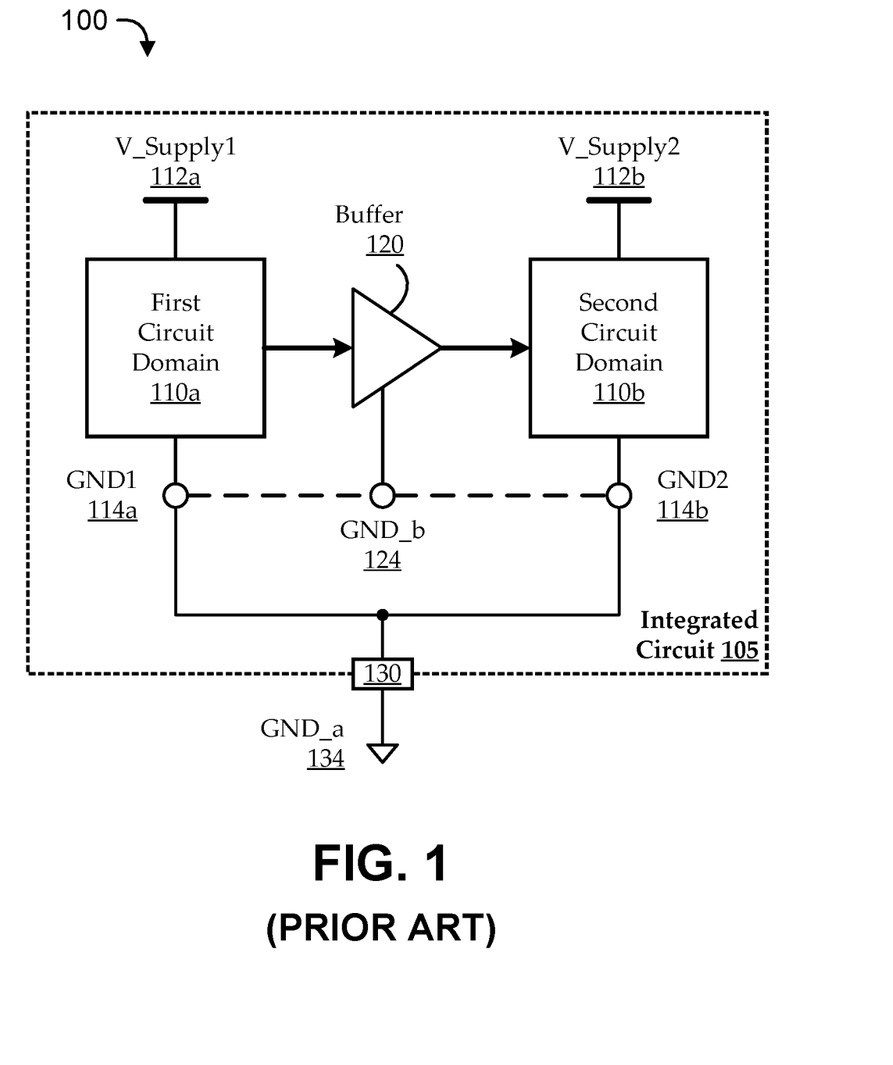
FIG. 1 shows an illustrative integrated circuit environment.

For the sake of context, FIG. 1 shows an illustrative integrated circuit environment 100. The illustrated environment 100 shows a simplified portion of an integrated circuit 105 having two circuit domains 110 and a buffer 120. For example, each circuit domain 110 is a radiofrequency circuit that performs a function on a signal, such as on a digital clock or data signal. As illustrated, each circuit domain 110 has its own supply voltage 112 and its own reference ground 114. The circuit domains 110 can differ with respect to the respective amount of noise each tends to produce and/or the respective noise sensitivity of each.

Suppose, for example, that the first circuit domain 110a includes a relatively quiet and noise-sensitive circuit, while the second circuit domain 110b includes a relatively noisy circuit. In many instances, on-chip grounds are not coupled with a stable ground reference. Accordingly, the noisy circuitry of circuit domain 110b can produce noise on the ground signal seen at the reference ground 114b of the second circuit domain 110b. Such noise can couple between circuit domains 110 through the floating ground paths of the integrated circuit 105. For example, as illustrated, the reference grounds 114 of the various circuit domains 110 can often be coupled with a common ground node 130 (e.g., a ground pin) of the integrated circuit 105 via one or more bond wires, or the like; and that ground node 130 (e.g., "on-chip ground") can be coupled with some external ground reference 134 (e.g., "off-chip ground," "absolute ground," etc.). Some integrated circuits use various types of meshes and/or other techniques to minimize coupling of ground noise across the common ground node 130 (e.g., and/or across bond wires, ground planes, etc.).

In addition to noise coupling between the circuit domains 110 via inter-domain ground signal paths, noise can also couple between digital (e.g., clock and/or data) signal paths. When transferring digital signals from the first circuit domain 110a to the second circuit domain 110b, noise from the second circuit domain 110b can couple back to the first circuit domain 110a, adversely impacting performance of the noise-sensitive circuitry of the first circuit domain 110a. In such cases, the digital signals can be passed through an intermediate buffer 120 to help isolate the circuitry of the first circuit domain 110a from the noise produced by the second circuit domain 110b.

Conventional approaches tend to assume that limiting inter-domain noise coupling through inter-domain signal paths and through inter-domain ground paths effectively eliminates noise coupling between the circuit domains 110. However, such approaches fail to recognize that noise can also couple through the ground path added along with adding the buffer 120. As illustrated, the buffer 120 also includes a buffer ground 124. The buffer ground 124 is typically physically coupled to some local reference ground, such as to reference ground 114a or reference ground 114b. Regardless of whether the buffer ground 124 is physically coupled to the quieter reference ground 114a or to the noisier reference ground 114b, the physical coupling can tend to permit ground noise coupling across the circuit domains 110 through the buffer 120.

Embodiments described herein seek to reduce ground noise coupling across the circuit domains 110 through the buffer 120. Embodiments include a novel ground intermediating buffer that can effectively use the reference grounds of the circuit domains on either side of the buffer stage to generate one or more intermediated grounds for one or more signal buffers. For example, one of the reference grounds has a first amount of ground noise, the other of the reference grounds has a second amount of ground noise that is greater than or less than the first amount, and the intermediated grounds are generated to have respective amounts of ground noise that are between the first and second amounts. The ground intermediating buffer can perform signal buffering with respect to the intermediated ground(s), thereby reducing ground noise coupling across the circuit domains through both the signal and ground paths of the buffer stage.

Instead of having one large delta between a source signal (referred to a source ground in a first circuit domain) and a receiving ground (in a second circuit domain with a different amount of noise), the ground intermediating buffer can effectively produce smaller deltas (smaller reference ground bounces) by introducing the one or more intermediated grounds; and the referring grounds and signal can transfer through these smaller reference ground bounces. Such an approach can provide a number of features. One feature is that the effects from ground bounce will manifest as small signal effects, since the delta between the source signal and each subsequent receiving ground can be small enough not to cause large signal behavior. Another feature is that, since spectral phase noise and other noise tend to add in terms of power, while the ground bounce is divided in terms of voltage, the amount of spectral phase noise and other noise will tend to be reduced in accordance with the number of intermediate stages.

Figure 2:
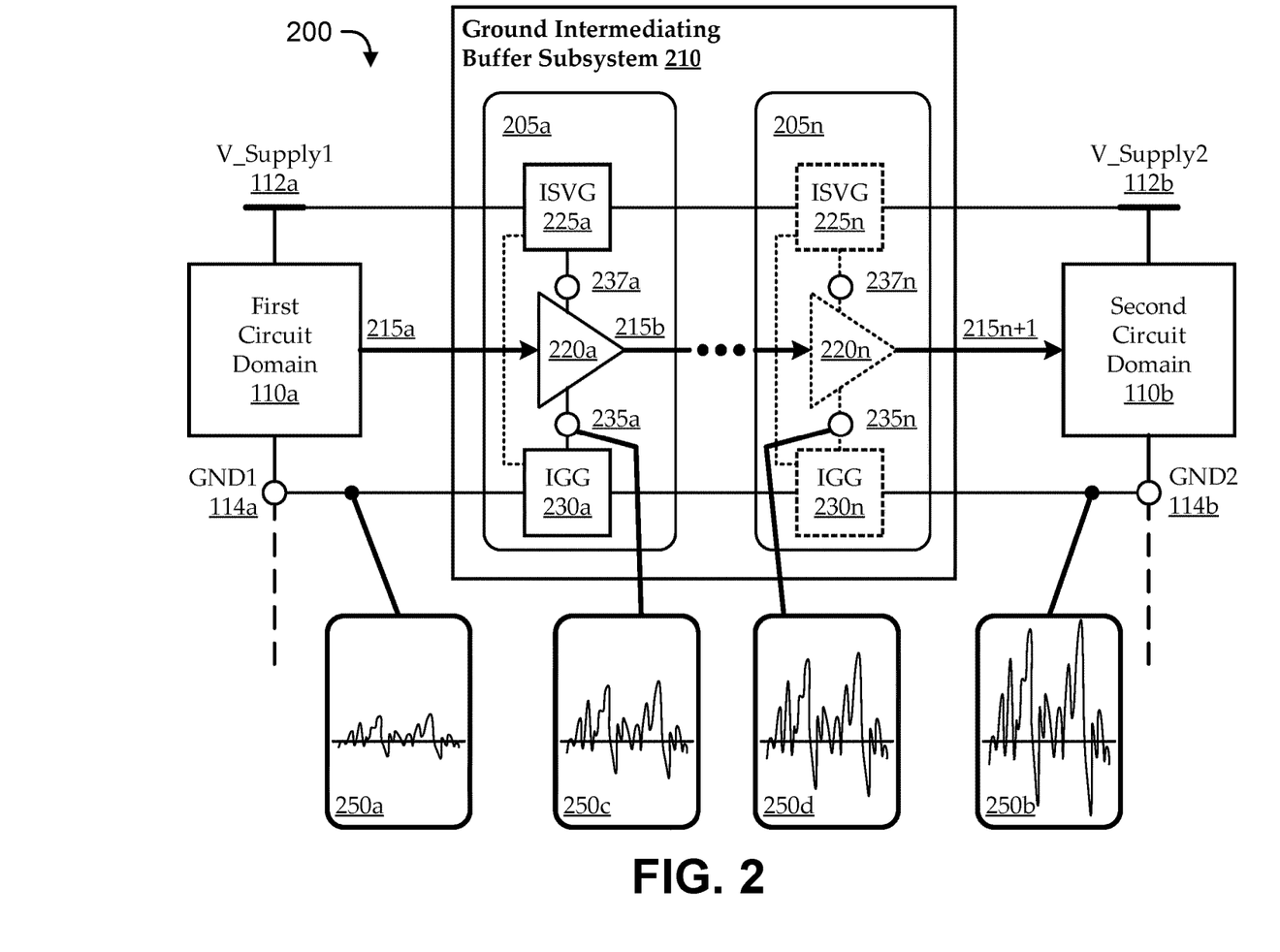
FIG. 2 shows a portion of an illustrative integrated circuit environment having a novel ground intermediating buffer subsystem, according to various embodiments.

FIG. 2 shows a portion of an illustrative integrated circuit environment 200 having a novel ground intermediating buffer subsystem 210, according to various embodiments. For the sake of context, the illustrated environment 200 shows a first circuit domain 110a and a second circuit domain 110b. Each circuit domain 110 can include any suitable circuit that is driven by a respective supply voltage 112, referenced to a respective reference ground 114, and operates on a signal 215 (e.g., a radiofrequency signal), such as a clock or data signal. It is assumed that one of the circuit domains 110 is noisier than the other, such that its respective reference ground 114 tends to have more ground noise. For example, the first (or second) circuit domain 110a can be a relatively noisy circuit producing a relatively large quantity of ground noise, and the second (or first) circuit domain 110b can be a relatively quiet circuit producing a relatively small quantity of ground noise; such that there is a large delta between the noise levels of the two reference grounds 114. For example, waveform 250a represents an illustrative first reference ground 114a waveform having a relatively small quantity of ground noise, and waveform 250b represents an illustrative second reference ground 114b waveform having a relatively large quantity of ground noise.

The first circuit domain 110a and the second circuit domain 110b can operate together as part of a signal path of the signal 215, such that the signal 215 is generally communicated from the first circuit domain 110a to the second circuit domain 110b. However, as described above with reference to FIG. 1, it is generally desirable to communicate the signal 215 in a manner that avoids coupling noise from one of the circuit domains 110 into the other. For example, directly coupling both the signal and reference ground terminals of the circuit domains 110 can allow noise to couple between the two circuit domains 110 through both the signal and reference ground paths. A signal buffer can be added to mitigate coupling of noise through the signal path, and techniques can be used to avoid coupling of noise through the reference ground paths, but addition of the buffer with its own ground can add a new path through which noise can be coupled across the circuit domains 110.

Embodiments of the ground intermediating buffer subsystem 210 seek to provide one or more signal buffering domains in the signal path while also mitigating coupling of noise through the ground path of the signal buffering domain(s). As illustrated, embodiments of the ground intermediating buffer subsystem 210 include one or more ground intermediating buffering domains 205, each including a ground intermediator 230 and a signal buffer 220. Embodiments of the ground intermediator 230 are coupled between the first reference ground 114a (i.e., the circuit ground of the first circuit domain 110a) and a second reference ground 114b (i.e., the circuit ground of the second circuit domain 110b) to generate an intermediated ground 235. Operation of the first circuit domain 110a produces a first quantity of ground noise on the first reference ground 114a, operation of the second circuit domain 110b produces a second quantity of ground noise on the second reference ground 114b, and the intermediated ground 235 is generated to have a third quantity of ground noise between the first quantity of ground noise and the second quantity of ground noise. Waveform 250c represents an illustrative intermediated reference 235 waveform having a quantity of ground noise between that of the first and second quantities of ground noise.

Some embodiments of the ground intermediating buffer subsystem 210 also include a supply voltage intermediator 225 (e.g., or an instance of the supply voltage intermediator 225 in each ground-intermediating buffering stage). As illustrated, the first circuit domain 110a is driven by a first supply voltage 112a, the second circuit domain 110b is driven by a second supply voltage 112b, and embodiments of the supply voltage intermediator are coupled between the first supply voltage 112a and the second supply voltage 112b to generate an intermediated supply voltage 237. In some embodiments, the ground intermediator 230 and the supply voltage intermediator 225 are coupled together (e.g., via a bypass capacitor, or other component) to ensure that the intermediated ground 235 and intermediated supply voltage 237 in each ground intermediating buffering domain 205 follow each other.

Embodiments of the signal buffer 220 can have a buffer output generated responsive to a buffer input. For example, the buffer input is coupled with a signal output node of the first circuit domain 110a by which to receive a first version of the signal 215a as output by the first circuit domain 110a, and the buffer output is coupled with a signal input node of the second circuit domain 110b by which to transmit a buffered version of the signal 215b responsive to receiving the first version of the signal 215a. The signal buffer 220 can be implemented as any suitable buffer. In some implementations, the signal buffer 220 is a voltage buffer (e.g., a voltage follower, or buffer amplifier having non-unity gain), for example, where the impedance level at the output of the first circuit domain 110a is higher than at the input of the second circuit domain 110b. In other implementations, the signal buffer 220 is a current buffer (e.g., a current follower, or buffer amplifier having non-unity gain), for example, where the impedance level at the output of the first circuit domain 110a is lower than at the input of the second circuit domain 110b. Embodiments of the signal buffer 220 are referenced to the intermediated ground 235 generated by the ground intermediator 230. In some embodiments, the signal buffer 220 is driven by the intermediated supply voltage 237 generated by the supply voltage intermediator 225.

Some embodiments of the ground intermediating buffer subsystem 210 include multiple ground intermediating buffering domains 205. Each ground intermediating buffering domain 205 can have a respective instance of the signal buffer 220 and a respective instance of the ground intermediator 230. In some implementations, each ground intermediating buffering domain 205 also includes its own respective instance of the supply voltage intermediator 225. For example, a first instance of the ground intermediator 230a is coupled between the first reference ground 114 and a second instance of the ground intermediator 230b (not shown), and the second instance of the ground intermediator 230b is coupled between the first instance of the ground intermediator 230a and the second reference ground 114b. Any suitable number of instances of ground intermediators 230 can be coupled between the first and second reference grounds 114 (illustrated in FIG. 2 as ground intermediators 230a . . . 230n).

In embodiments having multiple ground intermediating buffering domains 205, each instance of the ground intermediator 230 generates its own respective intermediated ground 235. Moving sequentially from the first reference ground 114a to the second reference ground 114b, each respective intermediated ground 235 can be generated to have a respective quantity of ground noise that is progressively closer to that of the second reference ground 114b. For example, as illustrated, a first intermediated reference 235a has a quantity of ground noise greater than that of the first reference ground 114a (as illustrated by the difference between waveform 250a and waveform 250c). An Nth intermediated ground 235n has progressively more ground noise than that of the first intermediated reference 235a (as illustrated by the difference between waveform 250c and waveform 250d), but still less than that of the second reference ground 114b (as illustrated by the difference between waveform 250d and waveform 250b). Thus, while there is a relatively large delta in quantity of ground noise between the two reference grounds 114, there is an appreciably smaller delta in quantity of ground noise between each progressive ground intermediating buffering domain 205, in sequence.

In such embodiments, each respective instance of the signal buffer 220 in sequence can receive a version of the signal 215 from the previous instance of the signal buffer 220 in sequence. For example, signal buffer 220a can receive signal 215a from the first circuit domain 110a and output a first buffered signal 215b, a next signal buffer 220b (not shown) can receive signal 215b from the first signal buffer 220a and output a second buffered signal 215c, and so on; until an Nth signal buffer 220n can receive signal 215n from the previous signal buffer 220n−1 and output a final buffered signal 215n+1 to the second circuit domain 110b. Each instance of the signal buffer 220 can be referenced to a respective intermediated ground 235 generated by a corresponding instance of the ground intermediator 230. Further, in some implementations, each ground intermediating buffering domain 205 includes a respective instance of the supply voltage intermediator 225 that generated a respective intermediated supply voltage 237; and each instance of the signal buffer 220 can be driven by a respective intermediated supply voltage 237 generated by a corresponding instance of the supply voltage intermediator 225.

Figure 3:
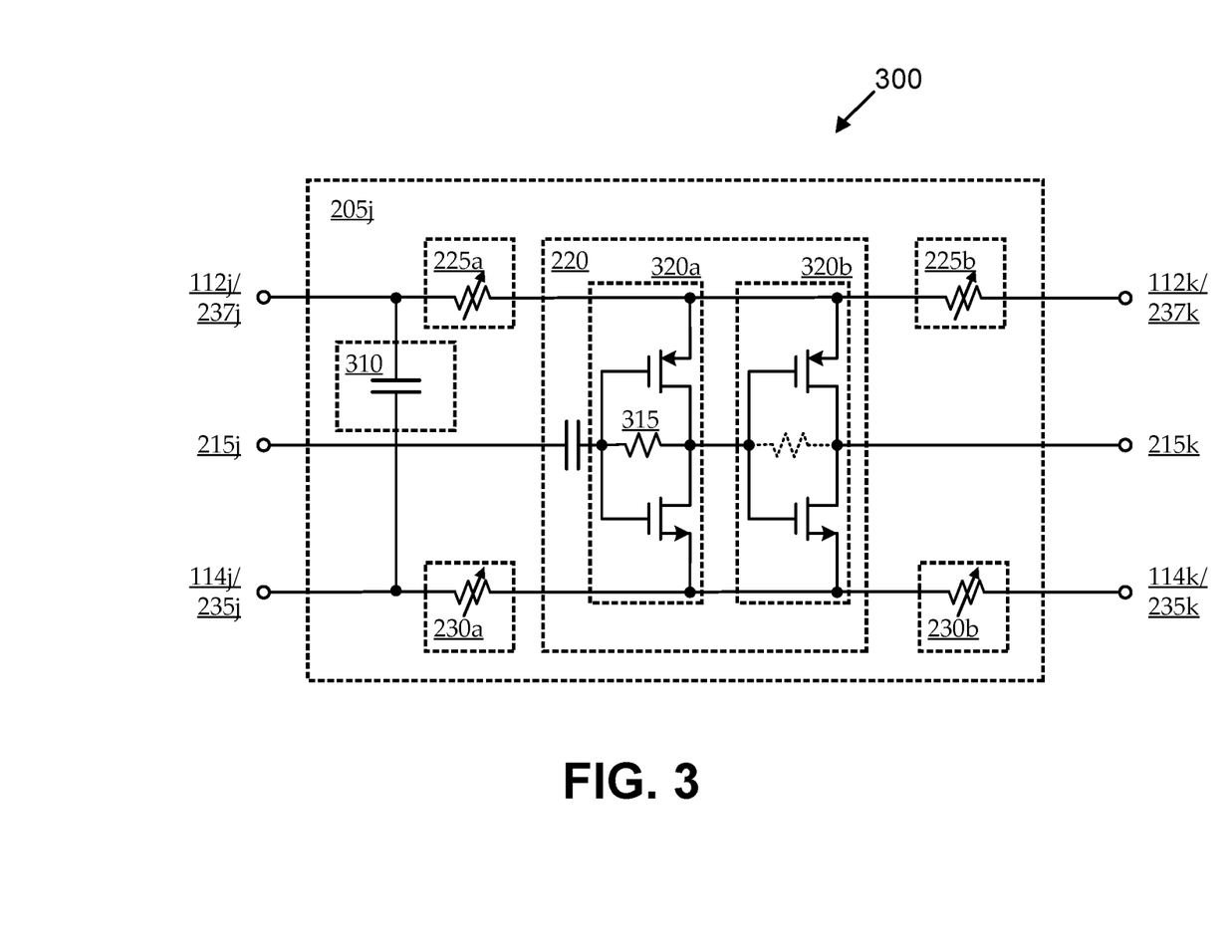
FIG. 3 shows a circuit diagram of an embodiment of an illustrative ground intermediating buffer, according to various embodiments.

FIG. 3 shows a circuit diagram of an embodiment of an illustrative ground intermediating buffer 300, according to various embodiments. The illustrated ground intermediating buffer 300 can represent a single ground intermediating buffering domain 205j of the ground intermediating buffer subsystem 210 of FIG. 2 (e.g., as an implementation of the ground intermediating buffer subsystem 210 having only a single ground intermediating buffering domain 205, or as a Jth ground intermediating buffering domain 205 of a multi-domain implementation of the ground intermediating buffer subsystem 210). The ground intermediating buffer 300 includes a ground intermediator 230, a supply voltage intermediator 225, and a signal buffer 220.

As illustrated, the ground intermediator 230 is coupled between two grounds, which may be two reference grounds 114 (in a single-domain implementation), two intermediated grounds 235 (in a multi-domain implementation), or one reference ground 114 and one intermediated ground 235. The ground intermediator 230 can be implemented as one or more resistors. In some implementations, the resistor(s) (or one or more resistors) are fixed resistors. In other implementations, the resistor(s) (or one or more resistors) are variable resistors. In still other embodiments, the ground intermediator 230 is implemented using one or more fixed or variable capacitors. As illustrated, the signal buffer 220 can be between two portions of the ground intermediator 230 (e.g., between two resistors that may or may not be the same).

Similarly, the supply voltage intermediator 225 can be coupled between two voltages, which may be two supply voltages 112 (in a single-domain implementation), two intermediated supply voltages 237 (in a multi-domain implementation), or one supply voltage 112 and one intermediated supply voltage 237. The supply voltage intermediator 225 can be implemented as one or more resistors (e.g., fixed or variable). In other implementations, the supply voltage intermediator 225 is implemented using one or more fixed or variable capacitors. The signal buffer 220 can be between two portions of the supply voltage intermediator 225 (e.g., between two resistors that may or may not be the same).

Some embodiments further include a bypass capacitor 310 (or other bypass element) coupled between a supply and a ground of the ground intermediating buffering domain 205. This can help ensure that the supply and ground for each ground intermediating buffering domain 205 follow each other. In some implementations, an instance of the bypass capacitor 310 is before and/or after each signal buffer 220 stage. In other implementations, a bypass capacitor 310 is at a first input stage and at a final output stage, and not in intermediate signal buffer 220 stages. In such implementations, local instances of the ground intermediator 230 and the supply voltage intermediator 225 in each intermediate stage can effectively ensure supply and ground following in context of gradual variations in noise level between those intermediate stages.

The signal buffer 220 can be implemented using one or more inverters 320. As illustrated, the received signal 215j (referred to the first ground 114j or 235j) is AC-coupled to a self-biased inverter 320a (using a large connecting resistor 315 coupled between its input and output nodes). The connecting resistor 315 effectively transfers from a first ground and supply combination on the input side of the ground intermediating buffering domain 205 to a subsequent ground and supply combination at the output of the ground intermediating buffering domain 205 (e.g., into a subsequent domain in a multi-domain implementation). The connecting resistor 315 value can be selected according to a lower bound and an upper bound. The lower bound can be set to avoid impacting characteristics of each of input and output domains; and the upper bound can be set, so that current through the inverter is small enough not to affect the DC or AC voltage levels of the first circuit domain 110a, second circuit domain 110b, or any ground intermediating buffering domains 205. In some implementations, a pair of inverters 320 is used. In the pair of inverters 320, one or both can be a self-biased inverter. For example, the second inverter 320b is shown as optionally a self-biased inverter (e.g., by using a large connecting resistor coupled between its input and output nodes), or a non-self-biased inverter (e.g., by having an open circuit between its input and output nodes). Using a pair of inverters 320 can maintain the polarity of the signal 215 as it passes through each ground intermediating buffering domain 205, and can also provide additional features (e.g., additional buffering).

Figure 4:
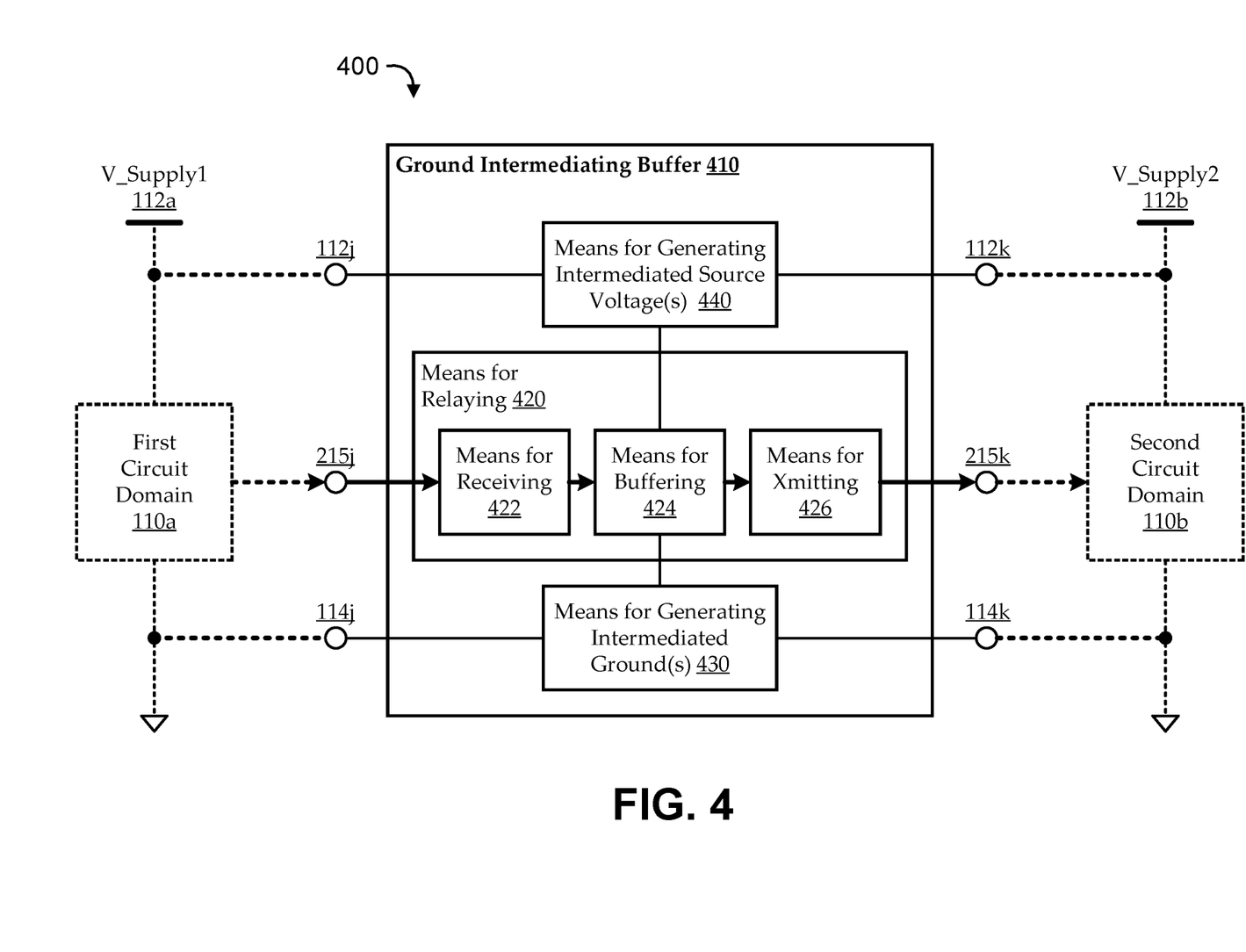
FIG. 4 shows a portion of an illustrative integrated circuit environment having another implementation of a ground intermediating buffer, according to various embodiments.

The circuit implementation of FIG. 3 represents an example approach for implementing novel ground intermediating buffering, as described herein. FIG. 4 shows a portion of an illustrative integrated circuit environment 400 having another implementation of a ground intermediating buffer 410, according to various embodiments. For the sake of context, the illustrated environment 400 shows a first circuit domain 110a and a second circuit domain 110b, each driven by a respective supply voltage 112, referenced to a respective reference ground 114, and operating on a signal 215. The illustrated ground intermediating buffer 410 includes means for generating an intermediated ground 430 responsive to a first circuit ground of the first circuit domain 110 (reference ground 114a) and a second circuit ground of the second circuit domain 110b (reference ground 114b). Operation of the first circuit domain 110a produces a first quantity of ground noise on the first circuit ground and operation of the second circuit domain 110b produces a second quantity of ground noise on the second circuit ground, and the intermediated ground is generated to have a third quantity of ground noise that is between the first quantity of ground noise and the second quantity of ground noise.

The ground intermediating buffer 410 also includes means for relaying a radiofrequency signal 420. The means for relaying a radiofrequency signal 420 include means for receiving the radiofrequency signal 422 from the first circuit domain 110a, means for buffering the radiofrequency signal 424; and means for transmitting the buffered signal 426 to the second circuit domain 110b. The means for buffering the radiofrequency signal 424 are referenced to the intermediated ground to output the buffered signal corresponding to the radiofrequency signal. In some embodiments, the ground intermediating buffer 410 includes means for generating an intermediated supply voltage 440 responsive to a first supply voltage 112a of the first circuit domain 110a and a second supply voltage 112b of the second circuit domain 112b. In such embodiments, the means for buffering 424 can be driven by the intermediated supply voltage.

In some embodiments, the means for generating an intermediated ground 430 include means for generating a plurality of intermediated grounds ranging from a first intermediated ground to an Nth intermediated ground, the first intermediated ground coupled most closely to the first circuit ground, and the Nth intermediated ground coupled most closely to the second circuit ground. For example, each of the N intermediated grounds is generated to have a different respective quantity of ground noise, such that, for any Kth one of the N intermediated grounds (GK) (e.g., coupled sequentially between the first and second reference grounds 114), the respective quantity of ground noise of GK is closer to the first quantity of ground noise, and the respective quantity of ground noise of GK+1 is closer to the second quantity of ground noise. In some such embodiments, the respective quantity of ground noise for each GK differs from the respective quantity of ground noise of each GK+1 by a substantially constant noise delta. In some embodiments, the means for generating the intermediated supply voltage 440 can be implemented similarly to the means for generating an intermediated ground 430. For example, the means for generating the intermediated supply voltage 440 can include means for generating a plurality of intermediated supply voltages ranging from a first intermediated supply voltage to an Nth intermediated supply voltage, the first intermediated supply voltage coupled most closely to the first supply voltage and having a respective voltage level closest to that of the first supply voltage relative to all others of the plurality of intermediated supply voltages, and the Nth intermediated supply voltage coupled most closely to the second supply voltage and having a respective voltage level closest to that of the second supply voltage relative to all others of the plurality of intermediated supply voltages.

In some embodiments, the means for generating an intermediated ground 430 and/or the means for generating the intermediated supply voltage 440 can be dynamically responsive. In some implementations, the means for generating an intermediated ground 430 can be responsive to the first circuit ground and the second circuit ground (and/or means for generating a particular one of the plurality of intermediated grounds can be responsive to the means for generating one or both adjacent ones of the plurality of intermediated grounds) to dynamically adjust the third quantity of ground noise to stay between the first quantity of ground noise and the second quantity of ground noise. For example, one or more variable components can dynamically adjust their respective values to produce a quantity of noise that remains between the first quantity of ground noise and the second quantity of ground noise even when there is a change in the first quantity of ground noise and/or in the second quantity of ground noise. The dynamic responsiveness can be implemented using a feedback circuit, a state machine with a lookup table for different conditions, a machine learning algorithm implemented by a processor, or in any other suitable manner.

Figure 5:
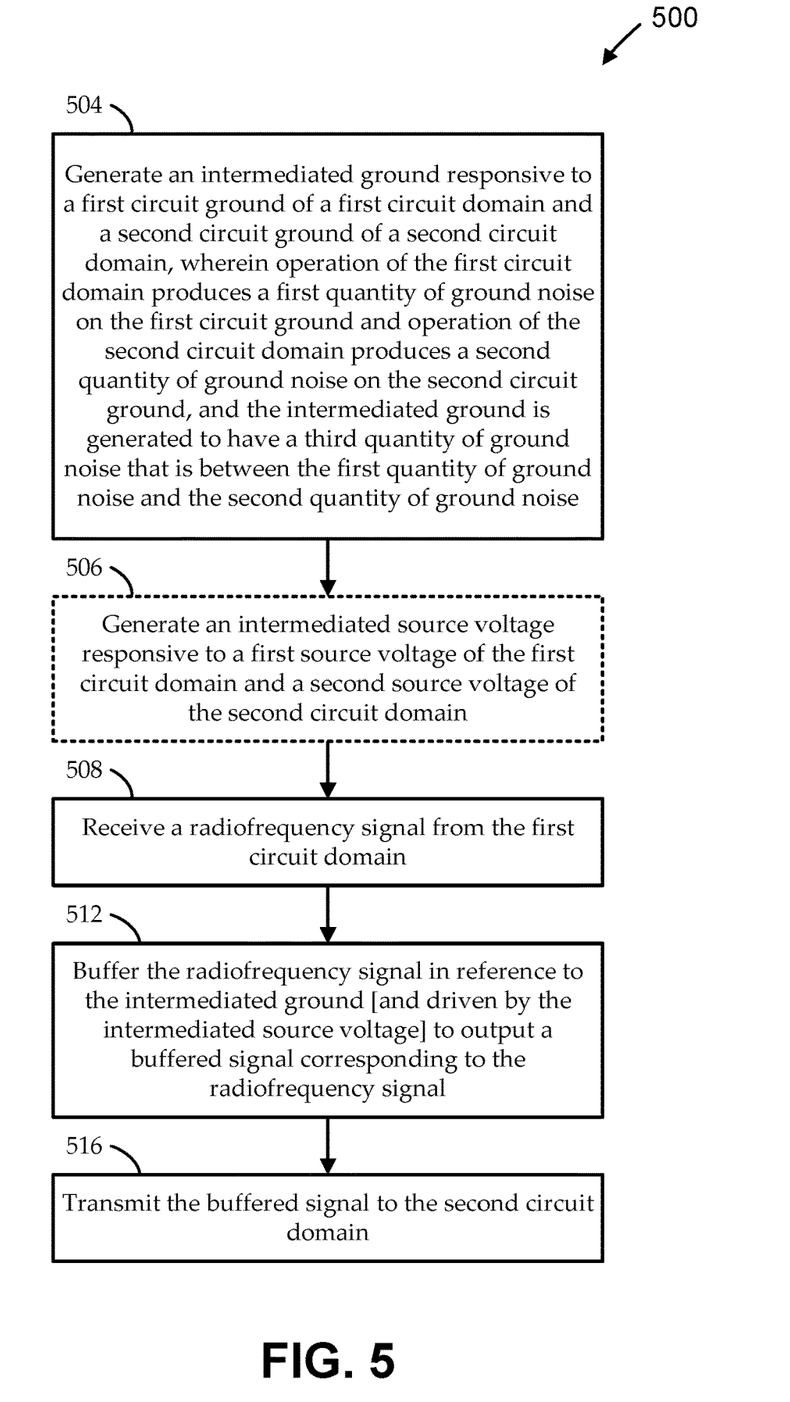
FIG. 5 shows a flow diagram of an illustrative method for ground intermediating buffering, according to various embodiments.

FIG. 5 shows a flow diagram of an illustrative method 500 for ground intermediating buffering, according to various embodiments. Embodiments of the method 500 begin at stage 504 by generating an intermediated ground responsive to a first circuit ground of a first circuit domain and a second circuit ground of a second circuit domain, wherein operation of the first circuit domain produces a first quantity of ground noise on the first circuit ground and operation of the second circuit domain produces a second quantity of ground noise on the second circuit ground, and the intermediated ground is generated to have a third quantity of ground noise that is between the first quantity of ground noise and the second quantity of ground noise. In some embodiments, the generating at stage 504 includes generating multiple intermediated grounds ranging sequentially from a first intermediated ground to an Nth intermediated ground, such that any Kth one of the N intermediated grounds in sequence (GK) has a respective quantity of ground noise that is closer to the first quantity of ground noise than that of any next one of the N intermediated grounds in sequence (GK+1). In some embodiments, the generating at stage 504 includes dynamically adjusting the third quantity of ground noise to stay between the first quantity of ground noise and the second quantity of ground noise in response to a change in the first quantity of ground noise and/or the second quantity of ground noise.

In some embodiments, at stage 506, an intermediated supply voltage can be generated responsive to a first supply voltage of the first circuit domain and a second supply voltage of the second circuit domain. At stage 508, embodiments can receive a radiofrequency signal from the first circuit domain. At stage 512, embodiments can buffer the radiofrequency signal in reference to the intermediated ground (e.g., and driven by the intermediated supply voltage) to output a buffered signal corresponding to the radiofrequency signal. At stage 516, embodiments can transmit the buffered signal to the second circuit domain.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A ground intermediating buffer circuit comprising:
    a ground input node configured to couple with a first ground signal, the first ground signal being at a ground reference of a first circuit domain and comprising a input quantity of ground noise during operation of the first circuit domain;
    a ground output node configured to couple with a second ground signal, the second ground signal being at a ground reference of a second circuit domain and comprising a output quantity of ground noise during operation of the second circuit domain;
    a buffer input node configured to couple with a data signal output of the first circuit domain;
    a buffer output node configured to couple with a data signal output of the second circuit domain;
    a ground intermediator circuit configured to generate an intermediated ground, responsive to the ground input node and the ground output node, to have a third quantity of ground noise between the input and output quantities of ground noise; and
    a signal buffer circuit configured, responsive to receiving an input data signal at the buffer input node, to generate an output data signal on the buffer output node referenced to the intermediated ground.

2. The ground intermediating buffer circuit of claim 1, further comprising:
    a first supply voltage node configured to couple with a first supply voltage driving the first circuit domain;
    a second supply voltage node configured to couple with a second supply voltage driving the second circuit domain; and
    a supply voltage intermediator circuit to generate an intermediated supply voltage responsive to the first supply voltage node and the second supply voltage node,
    wherein the signal buffer circuit is driven by the intermediated supply voltage.

3. The ground intermediating buffer circuit of claim 2, further comprising:
    a first bypass capacitor coupled between the first supply voltage node and the ground input node; and
    a second bypass capacitor coupled between the second supply voltage node and the ground output node.

4. The ground intermediating buffer circuit of claim 1, wherein the ground intermediator circuit comprises N ground intermediator sub-circuits, each Mth ground intermediator sub-circuit of the N ground intermediator sub-circuits being configured to generate a respective Mth intermediated ground, responsive to a Mth ground node and a (M+1)th ground node, to have a Mth quantity of ground noise between (M−1)th and (M+1)th quantities of ground noise, such that:

for M=1, the ground intermediator sub-circuit is configured to generate a first intermediated ground, responsive to the ground input node and a second ground node, to have a first quantity of ground noise between the input quantity of ground noise and a second quantity of ground noise; and
    for M=N, the ground intermediator sub-circuit is configured to generate a Nth intermediated ground, responsive to an Nth ground node and the ground output node, to have a Nth quantity of ground noise between the (N−1)th quantity of ground noise and the output quantity of ground noise,
    wherein N and M are positive integers.

5. The ground intermediating buffer circuit of claim 4, wherein N is greater than 1.

6. The ground intermediating buffer circuit of claim 4, wherein:
    the output quantity of ground noise differs from the input quantity of ground noise by a magnitude ($\Delta$); and
    each of the N ground intermediator sub-circuits is nominally identical, such that each Mth quantity of ground noise differs from each (M−1)th quantity of ground noise nominally by $\Delta/(N+1)$.

7. The ground intermediating buffer circuit of claim 4, wherein the signal buffer circuit comprises N signal buffer sub-circuits, each Mth signal buffer sub-circuit being referenced to the Mth intermediated ground and configured to generate a Mth buffer output signal at a Mth output node responsive to receiving a Mth buffer input signal at a Mth input node, such that:
    for M=1, the signal buffer sub-circuit is a first signal buffer sub-circuit being referenced to the first intermediated ground and configured to generate a first buffer output signal at a first output node responsive to receiving the input data signal at the buffer input node; and
    for M=N, the signal buffer sub-circuit is a Nth signal buffer sub-circuit being referenced to the Nth intermediated ground and configured to generate the output data signal on the buffer output node responsive to receiving a (N−1)th buffer input signal at a (N−1)th input node.

8. The ground intermediating buffer circuit of claim 4, wherein each Mth ground intermediator sub-circuit comprises a respective Mth resistor having a respective first side coupled with the Mth ground node, and a respective second side coupled with the (M+1)th ground node, such that each Mth intermediated ground is at one of the respective first side or the respective second side of the Mth resistor.

9. The ground intermediating buffer circuit of claim 1, wherein the signal buffer circuit comprises a pair of inverters referenced to the intermediated ground, at least one of the pair of inverters being a self-biased inverter.

10. The ground intermediating buffer circuit of claim 1, wherein the ground intermediator circuit comprises a resistor having a first side coupled with the ground input node, and a second side coupled with the ground output node, such that the intermediated ground is at one of the first side or the second side of the resistor.

11. The ground intermediating buffer circuit of claim 10, wherein resistor is a variable resistor.

12. The ground intermediating buffer circuit of claim 1, further comprising:
    a ground reference node, configured to couple with a master ground node that is further coupled with the ground reference of the first circuit domain and the ground reference of the second circuit domain.

13. An integrated circuit system comprising:
a master ground reference;
a first radiofrequency circuit having a first circuit ground coupled with the master ground reference, and having a first signal output, wherein the first radiofrequency circuit produces a input quantity of ground noise on the first circuit ground while operating to generate a first data signal at the first signal output;
a second radiofrequency circuit having a second circuit ground coupled with the master ground reference, and having a first signal input, wherein the second radiofrequency circuit produces a output quantity of ground noise on the second circuit ground while operating to generate a second data signal responsive to receiving the first data signal at the first signal input;
a ground intermediator circuit coupled with the first circuit ground, the second circuit ground, and the master ground reference, to generate an intermediated ground to have a third quantity of ground noise between the input quantity of ground noise and the output quantity of ground noise; and
a signal buffer circuit to transmit the first data signal to the first signal input of the second radiofrequency circuit responsive to receiving the first data signal from the first signal output of the first radiofrequency circuit and buffering the first data signal with reference to the intermediated ground.

14. The integrated circuit system of claim 13, further comprising:
a first supply voltage reference, the first radiofrequency circuit coupled with and driven by the first supply voltage reference;
a second supply voltage reference, the second radiofrequency circuit coupled with and driven by the second supply voltage reference; and
a supply voltage intermediator circuit to generate an intermediated supply voltage responsive to the first and second supply voltage references,
wherein the signal buffer circuit is driven by the intermediated supply voltage.

15. The integrated circuit system of claim 13, further comprising:
a first bypass capacitor coupled between the first supply voltage reference and the first circuit ground; and
a second bypass capacitor coupled between the second supply voltage reference and the second circuit ground.

16. The integrated circuit system of claim 13, wherein the ground intermediator circuit comprises N ground intermediator sub-circuits, each Mth ground intermediator sub-circuit of the N ground intermediator sub-circuits being configured to generate a respective Mth intermediated ground, responsive to a Mth ground node and a (M+1)th ground node, to have a Mth quantity of ground noise between (M−1)th and (M+1)th quantities of ground noise, such that:
for M=1, the ground intermediator sub-circuit is configured to generate a first intermediated ground, responsive to the first circuit ground and a second ground node, to have a first quantity of ground noise between the input quantity of ground noise and a second quantity of ground noise; and
for M=N, the ground intermediator sub-circuit is configured to generate a Nth intermediated ground, responsive to an Nth ground node and the second circuit ground, to have a Nth quantity of ground noise between the (N−1)th quantity of ground noise and the output quantity of ground noise,
wherein N and M are positive integers.

17. The integrated circuit system of claim 16, wherein N is greater than 1.

18. The integrated circuit system of claim 17, wherein each Mth ground intermediator sub-circuit comprises a respective Mth resistor having a respective first side coupled with the Mth ground node, and a respective second side coupled with the (M+1)th ground node, such that each Mth intermediated ground is at one of the respective first side or the respective second side of the Mth resistor.

19. The integrated circuit system of claim 17, wherein the signal buffer circuit comprises N signal buffer sub-circuits, each Mth signal buffer sub-circuit being referenced to the Mth intermediated ground and configured to generate a Mth buffer output signal at a Mth output node responsive to receiving a Mth buffer input signal at a Mth input node, such that:
for M=1, the signal buffer sub-circuit is a first signal buffer sub-circuit being referenced to the first intermediated ground and configured to generate a first buffer output signal at a first output node responsive to receiving the first data signal at the buffer input node; and
for M=N, the signal buffer sub-circuit is a Nth signal buffer sub-circuit being referenced to the Nth intermediated ground and configured to output the first data signal on the buffer output node responsive to receiving a (N−1)th buffer input signal at a (N−1)th input node.

20. The integrated circuit system of claim 19, wherein each Mth signal buffer sub-circuit comprises a respective pair of inverters referenced to the Mth intermediated ground, at least one of the respective pair of inverters being a self-biased inverter.

* * * * *